(12) United States Patent
Zhang et al.

(10) Patent No.: US 8,895,889 B2
(45) Date of Patent: Nov. 25, 2014

(54) METHODS AND APPARATUS FOR RAPIDLY RESPONSIVE HEAT CONTROL IN PLASMA PROCESSING DEVICES

(71) Applicant: Applied Materials, Inc., Santa Clara, CA (US)

(72) Inventors: Chunlei Zhang, Santa Clara, CA (US); Richard Fovell, San Jose, CA (US); Ezra Robert Gold, Sunnyvale, CA (US); Ajit Balakrishna, Sunnyvale, CA (US); James P. Cruse, Santa Cruz, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/732,621

(22) Filed: Jan. 2, 2013

(65) Prior Publication Data

US 2013/0180963 A1   Jul. 18, 2013

Related U.S. Application Data

(63) Continuation of application No. 12/253,657, filed on Oct. 17, 2008.

(51) Int. Cl.
*B23K 10/00* (2006.01)
*H01L 21/67* (2006.01)
*H05B 7/18* (2006.01)
*H01J 37/32* (2006.01)

(52) U.S. Cl.
CPC ............ *H05B 7/18* (2013.01); *H01L 21/67069* (2013.01); *H01J 2237/2001* (2013.01); *H01J 37/32724* (2013.01)
USPC ............ 219/121.54; 219/121.55; 219/121.43; 118/724; 156/345.52; 156/345.53

(58) Field of Classification Search
USPC ............... 219/121.4, 121.43, 121.54, 121.55; 118/724, 725; 156/345.27, 345.53, 156/345.52
See application file for complete search history.

(56) References Cited

U.S. PATENT DOCUMENTS 5,478,429 A   12/1995   Komino et al.
5,673,750 A   10/1997   Tsubone et al.
(Continued)

FOREIGN PATENT DOCUMENTS

JP       2001-118838 A       4/2001
WO     WO 2005/111267 A2    11/2005

OTHER PUBLICATIONS

International Search Report and Written Opinion mailed May 11, 2010 for PCT Application No. PCT/US2009/060979.

(Continued)

*Primary Examiner* — Mark Paschall
(74) *Attorney, Agent, or Firm* — Moser Taboada; Alan Taboada

(57) ABSTRACT

Methods and apparatus for regulating the temperature of a component in a plasma-enhanced process chamber are provided herein. In some embodiments, an apparatus for processing a substrate includes a process chamber and an RF source to provide RF energy to form a plasma in the process chamber. A component is disposed in the process chamber so as to be heated by the plasma when formed. A heater is configured to heat the component and a heat exchanger is configured to remove heat from the component. A chiller is coupled to the heat exchanger via a first flow conduit having an on/off flow control valve disposed therein and a bypass loop to bypass the flow control valve, wherein the bypass loop has a flow ratio valve disposed therein.

8 Claims, 3 Drawing Sheets

(56) References Cited

U.S. PATENT DOCUMENTS

| | | |
|---|---|---|
| 5,935,340 A | 8/1999 | Xia et al. |
| 5,948,283 A | 9/1999 | Grosshart |
| 5,994,209 A | 11/1999 | Yieh et al. |
| 5,997,649 A | 12/1999 | Hillman |
| 6,019,848 A | 2/2000 | Frankel et al. |
| 6,026,896 A * | 2/2000 | Hunter .................... 165/206 |
| 6,717,115 B1 * | 4/2004 | Pfahnl et al. ............. 219/444.1 |
| 7,169,256 B2 | 1/2007 | Dhindsa et al. |
| 2002/0088547 A1 | 7/2002 | Tomoyasu et al. |
| 2005/0121186 A1 * | 6/2005 | Hudson et al. ............ 165/253 |
| 2006/0027169 A1 * | 2/2006 | Tsukamoto et al. ....... 118/724 |
| 2006/0213763 A1 * | 9/2006 | Furuya et al. ............. 204/192.1 |

OTHER PUBLICATIONS

Office Action from the Japanese Intellectual Property Office for Japanese Patent Application No. 2011-532277.

* cited by examiner

_US 8,895,889 B2_

METHODS AND APPARATUS FOR RAPIDLY RESPONSIVE HEAT CONTROL IN PLASMA PROCESSING DEVICES

CROSS-REFERENCE TO RELATED APPLICATIONS

This application is a continuation of co-pending U.S. patent application Ser. No. 12/253,657, filed Oct. 17, 2008, which is herein incorporated by reference.

FIELD

Embodiments of the present invention generally relate to semiconductor processing and to methods and apparatus for processing substrates.

BACKGROUND

Some processes for fabricating semiconductor devices on a substrate utilize plasma processing chambers in which a showerhead (for example) provided process gases to the processing chamber which may be ignited to form a plasma. Plasma processing, however, tends to increase the temperature of components inside the processing chamber, such as the showerhead. Moreover, for high RF power process conditions, the combination of plasma heating and the duration of the process step typically causes the temperature to undesirably overshoot a desired set point. Such temperature overshoots can impinge on the ability to strike plasmas, delay initiating semiconductor processing recipes, and degrade the quality of processing.

There are some ways to increase the cooling capacity of process chamber components to address the problem, such as to design new hardware to have better heat conductance, or to change the coolant temperature between idle mode and processing modes. However, such designs are undesirable due to inefficiencies and/or cost. For example, the time constant of typical heat exchangers or chillers is close to typical recipe times. Accordingly, merely lowering the coolant temperature will not enable heating of the tool at a constant temperature during idle mode unless a much larger heater is provided. However, implementation of such a design would requires a major tool redesign, as most of heaters are embedded in the tool body.

Thus, there is a need for improved methods and apparatus for heat control in a plasma processing chamber.

SUMMARY

Methods and apparatus for regulating the temperature of a component in a plasma-enhanced process chamber are provided herein. In some embodiments, an apparatus for processing a substrate includes a process chamber and an RF source to provide RF energy to form a plasma in the process chamber. A component is disposed in the process chamber so as to be heated by the plasma when formed. A heater is configured to heat the component and a heat exchanger is configured to remove heat from the component. A chiller is coupled to the heat exchanger via a first flow conduit having an on/off flow control valve disposed therein and a bypass loop to bypass the flow control valve, wherein the bypass loop has a flow ratio valve disposed therein.

In some embodiments, a method of controlling the temperature of component in a process chamber that is heated by a plasma when formed, heated by a heater, and cooled by a coolant fluid flow through a heat exchanger, includes providing a coolant at a first flow rate to the heat exchanger when the component requires a first cooling rate; and providing the coolant at a second flow rate to the heat exchanger when the component requires a second cooling rate, wherein the first flow rate and the second flow rate are both non-zero and non-equal. The first coolant flow is provided through a first flow conduit having an on/off flow control valve disposed therein. Providing the second coolant fluid flow can include bypassing the first flow conduit by closing the flow control valve and flowing the coolant through a bypass loop having a flow ratio valve disposed therein to set the second flow rate to a rate less than the first flow rate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only illustrative embodiments of this invention and are therefore not to be considered limiting of its scope, for the invention may admit to other equally effective embodiments.

Figure 1:
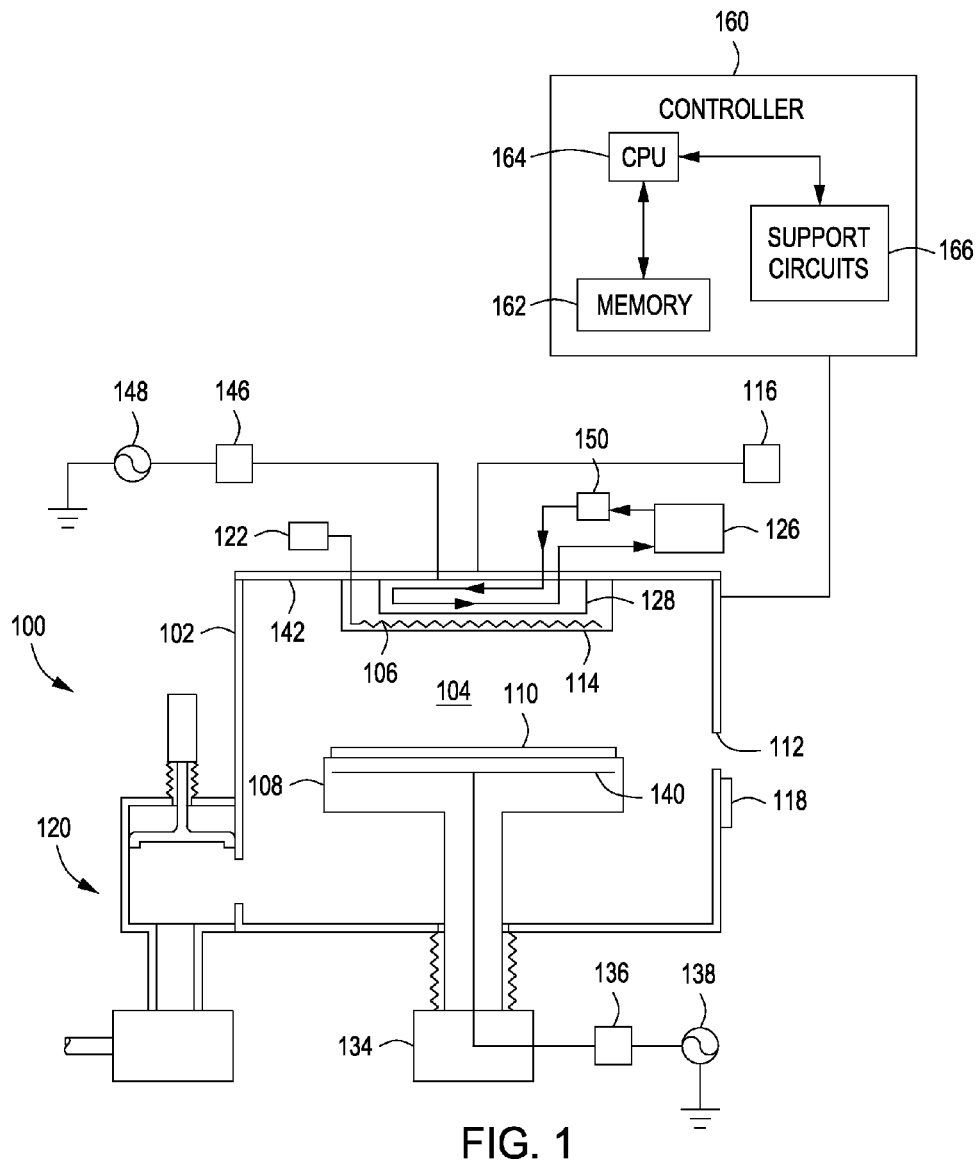
FIG. 1 depicts a process chamber in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention provide an apparatus for processing a substrate (e.g., a process chamber) having an improved system for regulating the temperature of components therein that could otherwise overshoot desired temperature set points by intermittent presence of a plasma in the process chamber. The improved temperature regulation system facilitates efficient use of the process device without delays between recipes and while minimizing process variation due to temperature effects.

Existing process chambers may be retrofit with an apparatus in accordance with the teachings provided herein, such as the DPS®, ENABLER®, ADVANTEDGE™, or other process chambers, available from Applied Materials, Inc. of Santa Clara, Calif. Other suitable chambers include any plasma processing chambers where temperature regulation of components of the process chamber exposed to the plasma is desired.

FIG. 1 depicts an illustrative substrate processing apparatus 100 in accordance with some embodiments of the present invention. The substrate processing apparatus 100 may comprise a process chamber 102 defining an inner processing volume 104 and having an exhaust system 120 coupled thereto for removing excess process gases, processing by-products, or the like, from the inner processing volume 104. The process chamber 102 generally includes a substrate support 108 disposed below the processing volume 104 for supporting a substrate 110 thereupon during processing and one or more gas inlets, such as a showerhead 114 and/or nozzles provided at desired locations (such as opposite a support surface of the substrate support 108).

In some embodiments, the substrate support 108 may include a mechanism (not shown) that retains or supports the substrate 110 on the surface of the substrate support 108, such as an electrostatic chuck, a vacuum chuck, a substrate retaining clamp, an edge ring, or the like. In some embodiments, the substrate support 108 may include mechanisms for controlling the substrate temperature (such as heating and/or cooling devices, not shown).

In some embodiments, the substrate support 108 may include mechanisms for controlling the species flux and/or ion energy proximate the substrate surface. For example, the substrate support 108 may include an RF bias electrode 140. The RF bias electrode 140 may be coupled to one or more bias power sources (one bias power source 138 shown) through one or more respective matching networks (matching network 136 shown). The one or more bias power sources may be capable of producing up to 12000 W at a frequency of about 2 MHz, or about 13.56 MHz, or about 60 MHz. In some embodiments, two bias power sources may be provided for coupling RF power through respective matching networks to the RF bias electrode 140 at a frequency of about 2 MHz and about 13.56 MHz. In some embodiments, three bias power sources may be provided for coupling RF power through respective matching networks to the RF bias electrode 140 at a frequency of about 2 MHz, about 13.56 MHz, and about 60 MHz. The at least one bias power source may provide either continuous or pulsed power. In some embodiments, the bias power source may be a DC or pulsed DC source.

The substrate 110 may enter the process chamber 102 via an opening 112 in a wall of the process chamber 102. The opening 112 may be selectively sealed via a slit valve 118, or other mechanism for selectively providing access to the interior of the chamber through the opening 112. The substrate support 108 may be coupled to a lift mechanism 134 that may control the position of the substrate support 108 between a lower position (as shown) suitable for transferring substrates into and out of the chamber via the opening 112 and one or more upper positions suitable for processing. The process position may be selected to maximize process uniformity for a particular process step. When in at least one of the upper processing positions, the substrate support 108 may be disposed above the opening 112.

The one or more gas inlets (e.g., the showerhead 114) may be coupled to a gas supply 116 for providing one or more process gases into the process chamber 102. Although a showerhead 114 is shown in FIG. 1, additional or alternative gas inlets may be provided such as nozzles or inlets disposed in the ceiling or on the sidewalls of the process chamber 102 or at other locations suitable for providing gases as desired to the process chamber 102, such as the base of the process chamber, the periphery of the substrate support pedestal, or the like.

In some embodiments, and as shown in FIG. 1, the substrate processing apparatus 100 may utilize capacitively coupled RF power provided to an upper electrode proximate an upper portion of the process chamber 102. Other embodiments can use inductively coupled RF power, other appropriate electrode locations, and the like. For example, the upper electrode may be a conductor formed, at least in part, by one or more of a ceiling 142, the showerhead 114, or the like, fabricated from a suitable conductive material. One or more RF power sources (one RF power source 148 shown in FIG. 1) may be coupled through one or more respective matching networks (matching network 146 shown in FIG. 1) to the upper electrode. The one or more plasma sources may be capable, for example, of producing up to 5000 W at a frequency of about 60 MHz and/or about 162 MHz. In some embodiments, two RF power sources may be coupled to the upper electrode through respective matching networks for providing RF power at frequencies of about 60 MHz and about 162 MHz. In some embodiments, two RF power sources may be coupled to the upper electrode through respective matching networks for providing RF power at frequencies of about 40 MHz and about 100 MHz.

In some embodiments, and as illustratively depicted in FIG. 1, the showerhead 114 may include temperature control mechanisms to facilitate control over the temperature of the showerhead 114 during idle and processing modes. For example, the showerhead 114 may include one or more heaters 106 (such as a resistive heating element), coupled to a power source 122. The one or more heaters 106 may be embedded heaters (as shown) or may be disposed in any suitable location for providing heat to the showerhead 114. The showerhead 114 may further include a heat exchanger 128 for removing heat from (e.g., cooling) the showerhead 114. Alternatively or in combination, the heat exchanger 128 (and/or other heat exchangers) can be located anywhere suitable to effectively remove heat from the component of interest (for example, the showerhead 114). For example the heat exchanger 128 may be placed adjacent to the component from which heat is to be removed, or adjacent to a second component having good thermal conductivity which may facilitate transferring heat from the component of interest through the second component to the heat exchanger 128.

A coolant fluid may be maintained at a desired temperature or temperature range by a chiller 126. The coolant fluid is circulated from the chiller 126 through the heat exchanger 128. In some embodiments, coolant fluid may be circulated from a chiller 126 through the heat exchanger 128 via a flow bypass kit 150. The flow bypass kit 150 is configured and controlled to dynamically provide two different coolant flow rates—a low flow rate during idle mode, to satisfy the need to maintain temperature without RF power being applied, and a high flow rate during processing to reduce temperature overshoot when RF power is being applied. In some embodiments, and as discussed further below, a model predictive control algorithm may be utilized to control the operation of flow bypass kit 150.

Figure 2:
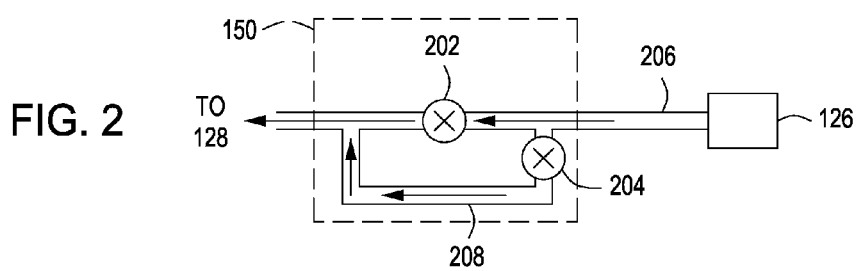
FIG. 2 depicts an illustrative bypass kit in accordance with some embodiments of the present invention.

An illustrative embodiment of the flow bypass kit 150 is depicted in FIG. 2. In some embodiments, the flow bypass kit 150 includes a control valve 202 disposed in a first conduit 206 coupling the chiller 126 to the heat exchanger 128 and a flow ratio valve 204 disposed in a bypass loop 208 around the control valve 202. The control valve 202 is controllable on/off valve that either allows flow therethrough when in the open position, or prevents flow therethrough in a closed position. The control valve 202 may be any suitable on/off valve, manual or automatic, such as a pneumatic valve, a solenoid valve, or the like.

The flow ratio valve 204 provides a variable flow (dependent upon a controllable position of the valve) that is less than the flow rate of the coolant through the control valve 202 by a pre-determined amount. As such, when the control valve 202 is open, a first flow rate of the coolant is determined by the flow rate of the coolant through the control valve 202 or by the sum of the flow rates of the coolant through the control valve 202 and the flow ratio valve 204. When the control valve 202 is closed, a second flow rate of the coolant is determined by the flow rate of the coolant through the flow ratio valve 204. Accordingly, the control valve 202 controls operation between a high flow rate and a low flow rate and the flow ratio valve 204 determines the flow ratio between the high flow rate and the low flow rate.

The flow ratio valve 204 can be manually or automatically operated and can be any suitable variable position valve, including incrementally positional valves (e.g., valves with finite set of positions) and infinitely positional valves (e.g., a valve that is positionable at any point between a maximum flow rate position and a minimum flow rate position). Examples of suitable flow ratio valves include needle valves, diaphragm valves, or the like.

In operation, the flow ratio valve 204 may be utilized to set a desired flow rate corresponding to the flow rate desired when the plasma is off, and therefore, when a lower heating load is present. The control valve 202 may be utilized to switch between a high coolant flow rate (e.g., through the open control valve 202) and a low coolant flow rate (e.g., through the bypass loop 208 when the control valve 202 is closed). Such high and low flow rates of the coolant may be selected to provide the cooling corresponding to the lower heat load when no plasma is present (such as when the chamber is idle) and to the higher heat load when a plasma is present (such as during processing). The heater 106 may be configured to be able to maintain the temperature of the showerhead 114 at a desired setpoint when the substrate processing apparatus 100 is in an idle mode, for example, with the heater 106 at between about 10 and about 90 percent of full power. In such a configuration, the heater PID control loop can provide fine control over the showerhead temperature against the heat exchanger 128 and any reading noise from the thermocouple or other temperature sensing mechanism, as discussed below.

Returning to FIG. 1, the temperature of the showerhead 114 can be measured in any suitable manner, such as by a temperature sensing device. Suitable temperature sensing devices include, for example, thermocouples, thermopiles, thermistors, resistance temperature detectors (RTDs), flexible optical fiber, and the like. The temperature sensing device may be coupled to the controller 160, or other suitable controller, to provide a feedback loop for controlling the temperature of the showerhead 114 (or other component of interest). In some embodiments, the temperature may be measured by a thermocouple disposed on the surface of the showerhead 114. Although discussed herein as relating to control over the temperature of the showerhead 114, the present invention may be used to advantage to control the temperature of any desired chamber component (for example, an electrostatic chuck) by incorporating a heater and a cooling system with a flow bypass kit as described herein.

The substrate processing apparatus 100 further comprises a controller 160 for controlling the operation of components of the substrate processing apparatus 100. For example, the controller may control the operation of the process chamber 102, for example, to process substrates according to desired process recipes. Part of such control is control over the temperature regulating components of the substrate processing apparatus 100, such as the heater 114, the chiller 126, and the flow bypass kit 150 (and/or any other components where temperature is to be controlled in accordance with the teachings provided herein).

The controller 160 is coupled to various components of the substrate processing apparatus 100 and comprises a central processing unit (CPU) 164, a memory 162, and support circuits 166 for the CPU 164. The controller 160 may control the substrate processing apparatus 100 directly, or via computers (or controllers) associated with particular process chamber and/or the support system components. The controller 160 may be one of any form of general-purpose computer processor that can be used in an industrial setting for controlling various chambers and sub-processors. The memory, or computer-readable medium, 162 of the CPU 164 may be one or more of readily available memory such as random access memory (RAM), read only memory (ROM), floppy disk, hard disk, flash, or any other form of digital storage, local or remote. The support circuits 166 are coupled to the CPU 164 for supporting the processor in a conventional manner. These circuits include cache, power supplies, clock circuits, input/output circuitry and subsystems, and the like. Inventive methods as described herein may be stored in the memory 162 as software routine that may be executed or invoked to control the operation of the substrate processing apparatus 100 in the manner described herein. The software routine may also be stored and/or executed by a second CPU (not shown) that is remotely located from the hardware being controlled by the CPU 164.

The substrate processing apparatus 100 may be controlled to process substrates as desired while controlling the temperature of desired components within the chamber to within predetermined desired limits. For example, the temperature regulating components of the substrate processing apparatus 100 disclosed above may be utilized to controlling the temperature of the showerhead 114 to within predetermined desired limits. Although illustrated herein with reference to the showerhead 114, other process chamber components may be temperature controlled in accordance with embodiments of the present invention. For example other suitable chamber components may include an electrostatic chuck, a baffle, or the like.

Figure 3:
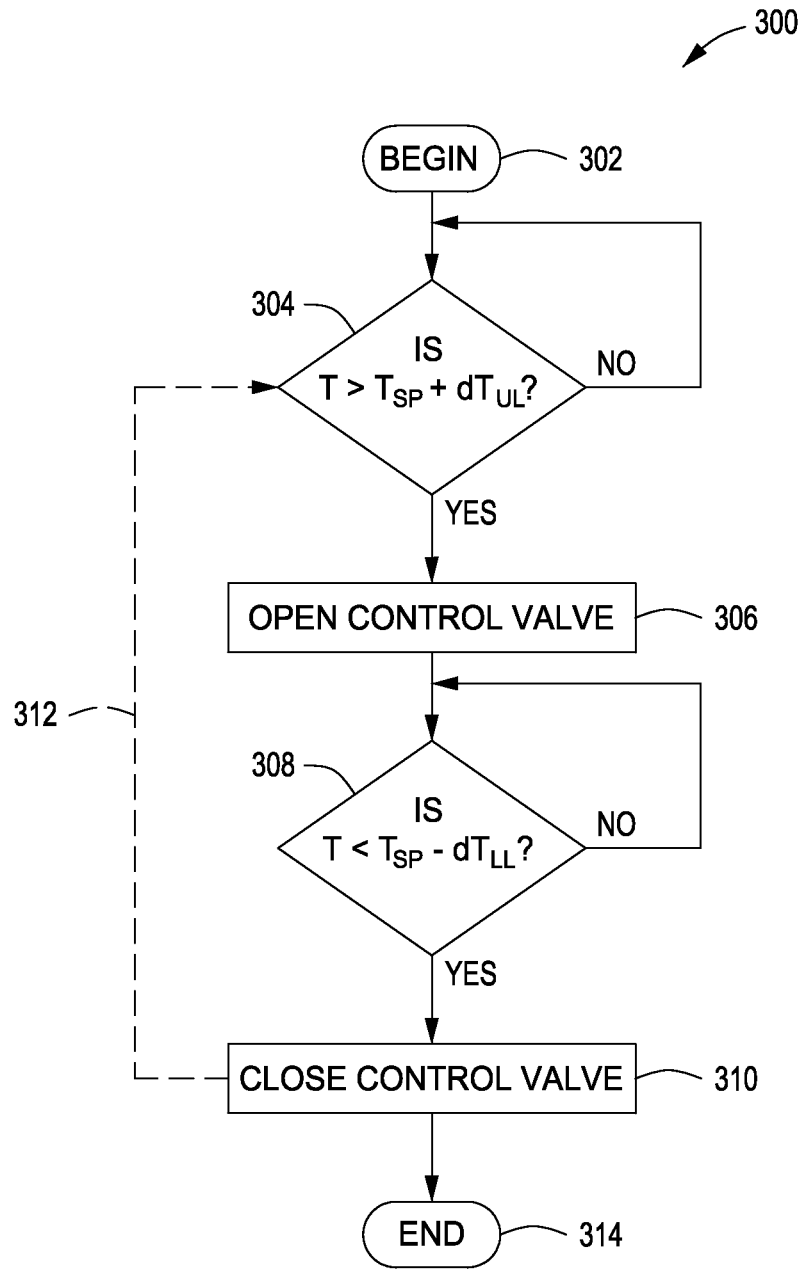
FIGS. 3-4 respectively illustrate control algorithms in accordance with some embodiments of the present invention.

One exemplary method 300 for controlling the temperature of a component within the substrate processing apparatus 100 is depicted in FIG. 3. The method 300 relates to control of the flow bypass kit 150 as described above to facilitate control of the temperature of the component (e.g., the showerhead 114) during processing cycles of the substrate processing apparatus 100. The component of interest may have a heater disposed in or proximate the component for providing heat to the component. The heater may further have a separate controller and/or control algorithm (e.g., a PID loop) for controlling the temperature of the component in conjunction with the method 300. For ease of understanding, the method 300 is described with respect to FIGS. 1-2.

The method 300 may illustratively begin at 302, where for the sake of illustration, it is presumed that a plasma is formed in the process chamber 102 and the control valve 202 of the flow bypass kit 150 is closed (as might occur when processing begins and the chamber was previously in an idle mode). The method 300 proceeds to 304 where the controller 160 determines if the temperature of the component (e.g., the showerhead 114) is greater than a predetermined upper temperature limit. The controller 160 may make this determination according to the following:

$$\text{is } T > T_{SP} + dT_{UL}? \qquad 1.$$

where T is the actual temperature of the chamber component of concern (e.g., the showerhead 114 in the above example), $T_{sp}$ is the set point, or target temperature, and $dT_{UL}$ is a predetermined temperature differential from the set point to reach an upper temperature limit. If the controller 160 determines that the actual temperature of the showerhead 114, as determined the thermocouple or other temperature sensing device, is not above the set point ($T_{sp}$) by the upper limit temperature differential ($dT_{UL}$), then processing continues and the controller 160 will continue to query, at 304, whether the temperature of the showerhead 114 is too high. If the controller 160 determines that the actual temperature of the showerhead 114 is above the set point ($T_{sp}$) by at least the upper limit temperature differential ($dT_{UL}$), then the controller 160 causes the control valve 202 of the flow bypass kit 150 to open, at 306, to increase the flow rate of the coolant flowing through the heat exchanger 128, thereby removing more heat from the showerhead 114 and lowering the temperature thereof.

Next, at 308, the controller 160 determines if the temperature of the component (e.g., the showerhead 114) is less than a predetermined lower temperature limit. This may occur if too much heat is removed from the showerhead 114, for example, because of an incorrect setting of the chiller temperature, cessation of plasma processing, or the like. The controller 160 may make this determination according to the following:

$$\text{is } T<T_{SP}-dT_{LL}? \qquad 2.$$

where $dT_{LL}$ is a predetermined temperature differential from the set point to reach a lower temperature limit. If the controller 160 determines that the actual temperature of the showerhead 114 is not lower than the set point ($T_{sp}$) by the lower limit temperature differential ($dT_{LL}$), then processing continues and the controller 160 will continue to query, at 308, whether the temperature of the showerhead 114 is too low. If the controller 160 determines that the actual temperature of the showerhead 114 is below the set point ($T_{sp}$) by at least the lower limit temperature differential ($dT_{LL}$), then the controller 160 causes the control valve 202 of the flow bypass kit 150 to close, at 310, to decrease the flow rate of the coolant flowing through the heat exchanger 128, thereby removing less heat from the showerhead 114 and raising the temperature thereof.

The above method may be repeated as desired through numerous processing cycles, such as, between substrates, multiple processing steps of a single substrate, or the like. As such, the method 300 may continue as depicted by dashed line 312, where the controller 160 again queries, at 304, whether the temperature of the component (e.g., the showerhead 114) is greater than the predetermined upper temperature limit. Alternatively, upon completion of processing, the method 300 may end at 314.

The above method 300 controls the flow bypass kit 150 in response to the actual temperature of the component being monitored (e.g., the showerhead 114). As such the above method 300 is a reactive method. In some embodiments of the present invention, a predictive method may be provided to facilitate avoiding temperature overshoots on either the heating or the cooling side of the temperature fluctuations of the component. The predictive method may further include the same control method as described above with respect to FIG. 3 to facilitate actually passing desired temperature differentials from the desired set point.

Figure 4:
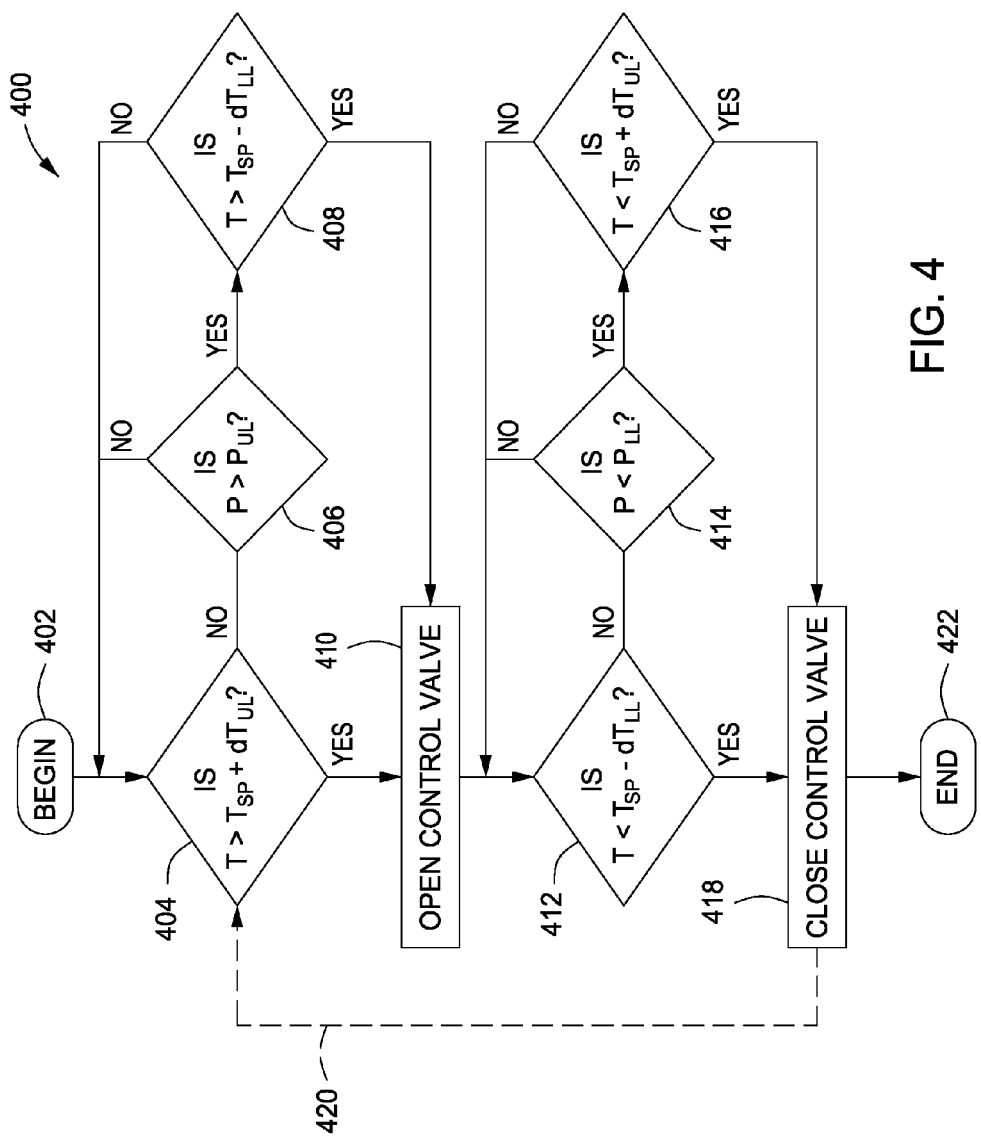

For example, FIG. 4 depicts a method 400 for controlling the temperature of a component within the substrate processing apparatus 100. The method 400 relates to control of the flow bypass kit 150 similar to as described above. For ease of understanding, the method 300 is described with respect to FIGS. 1-2. The method 400 may illustratively begin at 402, where for the sake of illustration, it is presumed that a plasma is formed in the process chamber 102 and the control valve 202 of the flow bypass kit 150 is closed (as might occur when processing begins and the chamber was previously in an idle mode).

The method 400 proceeds to 404 where the controller 160 determines if the temperature of the component (e.g., the showerhead 114) is greater than a predetermined upper temperature limit. The controller 160 may make this determination in the same manner as described above with respect to FIG. 3 at 304 (e.g., using equation 1). Specifically, the controller may query:

$$\text{is } T>T_{SP}+dT_{UL}? \qquad 1.$$

As before, if the controller 160 determines that the actual temperature of the showerhead 114 is above the set point ($T_{sp}$) by at least the upper limit temperature differential ($dT_{UL}$), then the controller 160 causes the control valve 202 of the flow bypass kit 150 to open, at 410, to increase the flow rate of the coolant flowing through the heat exchanger 128, thereby removing more heat from the showerhead 114 and lowering the temperature thereof.

However, if the controller 160 determines that the actual temperature of the showerhead 114 is not above the set point ($T_{sp}$) by the upper limit temperature differential ($dT_{UL}$), then the method continues to a predictive query at 406, where the controller 160 queries whether the total RF power being delivered to the chamber is greater than a predetermined upper limit. The controller 160 may make this determination according to the following:

$$\text{is } P>P_{UL}? \qquad 3.$$

where P is a power factor corresponding to the total RF power being delivered to the process chamber and $P_{UL}$ is a predetermined upper limit of RF power. In some embodiments, the upper limit, $P_{UL}$, may correspond to a highest power factor that provides sufficient heat to a component of interest such that an increased cooling load is required. In some embodiments, the power factor, P, may simply be the total power being delivered to the process chamber. For example, P may be defined as:

$$P=\Sigma P_i=P_1+P_2+\ldots+P_n \qquad \text{A.}$$

where $P_i$ is the RF power being delivered to the process chamber by a particular source. For example, $P_1+P_2+\ldots+P_n$ may correspond to the power delivered by one or more plasma sources (e.g., RF power source 148), one or more bias sources (e.g., bias power source 138), other RF sources coupled to other electrodes in the chamber, or the like.

In some embodiments, the power factor, P, may be a weighted combination of the total power being delivered to the process chamber. For example, P may be defined as:

$$P=\Sigma \omega_i P_i=\omega_1 P_1+\omega_2 P_2+\ldots+\omega_n P_n \qquad \text{B.}$$

where $\omega_i$ is a weighting factor for the particular source of RF power being delivered to the process chamber. For example, $\omega_1+\omega_2+\ldots+\omega_n$ may correspond to the power delivered by one or more plasma sources (e.g., RF power source 148), one or more bias sources (e.g., bias power source 138), other RF sources coupled to other electrodes in the chamber, or the like. The weighting factor accounts for varying contributions to the heat load of the component of interest and may be any number, positive, negative, or zero, dependent upon the contribution to the heat load of the component of interest for a respective source of RF power.

For example, when controlling the temperature of the showerhead 114, the weighting factor for RF power sources coupled to the showerhead 114 may be higher than that of RF bias sources coupled to the substrate support 108. In another example, when controlling the temperature of an electrostatic chuck in the support pedestal 108, the weighting factor for RF power sources coupled to the showerhead 114 may be lower than that of RF bias sources coupled to the substrate support 108. The determination of the various weighting factors, as well as the upper power limit $P_{UL}$, may be determined empirically or via modeling. As can be seen from the above, equation A is merely the special case where all weighting factors are equal to one.

If the controller 160 determines that P is lower than the desired upper limit for power delivery to the chamber (indicating a sustainable, or low heat load to the component of interest), then the method returns to 404 and proceeds anew. However, if the controller 160 determines that P is greater than the desired upper limit for power delivery to the chamber (indicating an unsustainable, or high heat load to the component of interest), then the method continues to 408, where the controller 160 queries if the temperature of the component (e.g., the showerhead 114) is greater than the predetermined lower temperature limit. The controller 160 may make this determination in the similar manner as described above with respect to FIG. 3 at 308 (except that the determination is that the temperature is above the lower temperature limit). Specifically, the controller may query:

$$\text{is } T > T_{SP} - dT_{LL}? \qquad 4.$$

If the controller 160 determines that the actual temperature of the showerhead 114 is not above the lower temperature limit (e.g., the set point ($T_{sp}$) minus the lower limit temperature differential ($dT_{LL}$)), then the control valve 202 remains closed to prevent further cooling of the component, and the method returns to 404 and cycles through the queries again.

If, however, the controller 160 determines that the actual temperature of the showerhead 114 is above the lower temperature limit (e.g., the set point ($T_{sp}$) minus the lower limit temperature differential ($dT_{LL}$)), then the controller 160 causes the control valve 202 of the flow bypass kit 150 to open, at 410, to increase the flow rate of the coolant flowing through the heat exchanger 128, thereby removing more heat from the showerhead 114 and lowering the temperature thereof.

Once the control valve 202 is open, the flow through the heat exchanger 128 is increased and the rate of heat removed from the showerhead 114 is also increased. Accordingly, the method 400 continues, at 412, where the controller 160 determines if the temperature of the component (e.g., the showerhead 114) is less than a predetermined lower temperature limit. The controller 160 may make this determination according to equation 2, as discussed above with respect to FIG. 3 at 308. Specifically, the controller may query:

$$\text{is } T < T_{SP} - dT_{LL}? \qquad 2.$$

As before, if the controller 160 determines that the actual temperature of the showerhead 114 is below the set point ($T_{sp}$) by at least the lower limit temperature differential ($dT_{LL}$), then the controller 160 causes the control valve 202 of the flow bypass kit 150 to close, at 418, to decrease the flow rate of the coolant flowing through the heat exchanger 128, thereby removing less heat from the showerhead 114 and raising the temperature thereof.

However, if the controller 160 determines that the actual temperature of the showerhead 114 is not lower than the set point ($T_{sp}$) by the lower limit temperature differential ($dT_{LL}$), then the method continues to a predictive query at 414, where the controller 160 queries whether the total RF power being delivered to the chamber is lower than a predetermined lower limit. The controller 160 may make this determination according to the following:

$$\text{is } P < P_{LL}? \qquad 5.$$

where $P_{LL}$ is a predetermined lower limit of RF power. The lower limit, $P_{LL}$ may be determined empirically or via modeling. In some embodiments, the lower limit, $P_{LL}$, may correspond to a lowest power factor that still provides sufficient heat to a component of interest such that an additional cooling load is not required. The power factor, P, may be determined as discussed above with respect to 406.

If the controller 160 determines that P is greater than the desired lower limit for power delivery to the chamber (indicating an unsustainable, or high heat load to the component of interest), then the method returns to 412 and the queries proceed anew. However, if the controller 160 determines that P is less than the desired lower limit for power delivery to the chamber (indicating a sustainable, or low heat load to the component of interest), then the method continues to 416, where the controller 160 queries if the temperature of the component (e.g., the showerhead 114) is lower than the predetermined upper temperature limit. The controller 160 may make this determination in the similar manner as described above with respect to FIG. 3 at 304 (except that the determination is that the temperature is below the upper temperature limit). Specifically, the controller may query:

$$\text{is } T < T_{SP} + dT_{UL}? \qquad 6.$$

If the controller 160 determines that the actual temperature of the showerhead 114 is above the upper temperature limit (e.g., the set point ($T_{sp}$) plus the upper limit temperature differential ($dT_{UL}$)), then the control valve 202 remains open to prevent further heating of the component, and the method returns to 412 and cycles through the queries again.

If, however, the controller 160 determines that the actual temperature of the showerhead 114 is less than the upper temperature limit (e.g., the set point ($T_{sp}$) plus the upper limit temperature differential ($dT_{UL}$)), then the controller 160 causes the control valve 202 of the flow bypass kit 150 to close, at 418, to decrease the flow rate of the coolant flowing through the heat exchanger 128, thereby removing less heat from the showerhead 114 and raising the temperature thereof.

The above method may be repeated as desired through numerous processing cycles, such as, between substrates, multiple processing steps of a single substrate, or the like. As such, the method 400 may continue as depicted by dashed line 420, where the controller 160 again queries, at 404, whether the temperature of the component (e.g., the showerhead 114) is greater than the predetermined upper temperature limit. Alternatively, upon completion of processing, the method 400 may end at 422.

In the above methods, the parameters $dT_{UL}$ and $dT_{LL}$ may be variable to reactively control the flow bypass kit 150 by feedback to the controller with respect to the showerhead temperature reading during processing. In addition, the above parameters and equipment constants, such as the power factor and weighting factors may be adjusted for different recipes as desired.

Thus, methods and apparatus for processing substrates have been provided herein that provide improved temperature regulation for components in a plasma enhanced substrate processing apparatus. The flow bypass kit of the present invention provides a low cost, easy retrofit that expands current component thermal control range without changing the design of heaters corresponding to such components. By restricting the coolant flow during idle modes of the processing apparatus, the heater output at idle may be greatly reduced and therefore save significant energy. The predictive control methods disclosed herein further achieve improved performance by preventing temperature overshoots.

While the foregoing is directed to embodiments of the present invention, other and further embodiments of the invention may be devised without departing from the basic scope thereof, and the scope thereof is determined by the claims that follow.

What is claimed is:

1. An apparatus for processing a substrate, comprising:
   a process chamber;
   an RF source to provide RF energy to form a plasma in the process chamber;
   a component disposed in the process chamber so as to be heated by the plasma when formed;
   a heater configured to heat the component;
   a heat exchanger configured to remove heat from the component;
   a chiller coupled to the heat exchanger via a first flow conduit having an on/off flow control valve disposed therein and a bypass loop to bypass the flow control valve, wherein the bypass loop has a flow ratio valve disposed therein;
   a controller for opening or closing the flow control valve;
   a temperature measuring device situated to indicate a temperature of the component; and
   input(s) into the controller indicating the power going to the plasma forming electrodes or groups of such electrodes;
   wherein the controller substantially operates according to the following control parameters:

| | |
   |---|---|
   | if $\Sigma\omega_i P_i > P_{UL}$ and $T > T_{sp} - dT_{LL}$ | open flow control valve |
   | if $\Sigma\omega_i P_i < P_{LL}$ and $T < T_{sp} + dT_{UL}$ | close flow control valve | where $T_{sp}$ is a target temperature, $dT_{UL}$ is a predetermined upwards temperature differential from the target temperature, $dT_{LL}$ is a predetermined downwards temperature differential from the target temperature, $P_i$ is the power consumption of one of i=1 to n plasma-forming electrodes and/or groups thereof, where $\omega_i$ is a weighting factor for one of i=1 to n sources of RF power being delivered to the process chamber, $P_{UL}$ is a predetermined upper limit for summed power consumption, and $P_{LL}$ is a predetermined lower limit for summed power consumption.

2. The apparatus of claim 1, wherein the controller further controls the control valve according to the following control parameters:

| | |
   |---|---|
   | if $T > T_{sp} + dT_{UL}$ | open flow control valve |
   | if $T < T_{sp} - dT_{LL}$ | close flow control valve | where $T_{sp}$ is the target temperature, $dT_{UL}$ is a predetermined upwards temperature differential from the target temperature, and $dT_{LL}$ is a predetermined downwards temperature differential from the target temperature.

3. The apparatus of claim 1, wherein the component is a showerhead for injecting gas into the process chamber.

4. The apparatus of claim 1, wherein the component is an electrostatic chuck for retaining a substrate.

5. A method of processing a substrate, comprising:
   providing a process chamber having a component disposed therein and a temperature measuring device situated to indicate a temperature of the component;
   providing RF energy from an RF source to form a plasma in the process chamber, wherein the plasma heats the component;
   heating the component with a heater;
   removing heat from the component via a heat exchanger, wherein a chiller is coupled to the heat exchanger via a first flow conduit having an on/off flow control valve disposed therein and a bypass loop to bypass the flow control valve, and wherein the bypass loop has a flow ratio valve disposed therein;
   providing input(s) into a controller indicating power going to plasma forming electrodes or groups of such electrodes; and
   opening or closing the flow control valve via the controller according to the following control parameters:

| | |
   |---|---|
   | if $\Sigma\omega_i P_i > P_{UL}$ and $T > T_{sp} - dT_{LL}$ | open flow control valve |
   | if $\Sigma\omega_i P_i < P_{LL}$ and $T < T_{sp} + dT_{UL}$ | close flow control valve | wherein $T_{sp}$ is a target temperature, $dT_{UL}$ is a predetermined upwards temperature differential from the target temperature, $dT_{LL}$ is a predetermined downwards temperature differential from the target temperature, $P_i$ is the power consumption of one of i=1 to n plasma-forming electrodes and/or groups thereof, where $\omega_i$ is a weighting factor for one of i=1 to n sources of RF power being delivered to the process chamber, $P_{UL}$ is a predetermined upper limit for summed power consumption, and $P_{LL}$ is a predetermined lower limit for summed power consumption.

6. The method of claim 5, wherein the controller further controls the control valve according to the following control parameters:

| | |
   |---|---|
   | if $T > T_{sp} + dT_{UL}$ | open flow control valve |
   | if $T < T_{sp} - dT_{LL}$ | close flow control valve | where $T_{sp}$ is the target temperature, $dT_{UL}$ is a predetermined upwards temperature differential from the target temperature, and $dT_{LL}$ is a predetermined downwards temperature differential from the target temperature.

7. The method of claim 5, wherein the component is a showerhead for injecting gas into the process chamber.

8. The method of claim 5, wherein the component is an electrostatic chuck for retaining a substrate.

* * * * *